US005489902A

United States Patent [19]
Shyu et al.

[11] Patent Number: 5,489,902
[45] Date of Patent: Feb. 6, 1996

[54] DYNAMIC POWER SAVING VIDEO DAC

[75] Inventors: Jyn-Bang Shyu, Cupertino; Roubik Gregorian, San Jose, both of Calif.

[73] Assignee: Sierra Semiconductor Corporation, San Jose, Calif.

[21] Appl. No.: 233,928

[22] Filed: Apr. 28, 1994

[51] Int. Cl.⁶ .................................................. H03M 1/66
[52] U.S. Cl. ............................................. 341/136; 341/144
[58] Field of Search ................................. 341/136, 144

[56] References Cited

U.S. PATENT DOCUMENTS

| | | | |
|---|---|---|---|
| 5,023,614 | 6/1991 | Fung et al. | 341/144 |
| 5,184,129 | 2/1993 | Fung et al. | 341/144 |
| 5,369,402 | 11/1994 | Kwon | 341/136 |

*Primary Examiner*—Howard L. Williams
*Attorney, Agent, or Firm*—Burns, Doane, Swecker & Mathis

[57] ABSTRACT

Power dissipation is reduced in a video DAC by providing a sleep mode in which DAC current sources are shut off during the blanking period in a manner that allows them to be rapidly turned back on at the end of sleep mode. In particular, a digital to analog converter includes a current source for producing a current, a current steering circuit connected to the current source, the current steering circuit including switches responsive to first and second control signals, respectively, for steering the current into either a load or a current return path, and a control circuit for generating the first and second signals each as a logical combination of a video data signal and a sleep signal. The sleep signal, when it is active, causes both the first and second switches to turn off, which in turn causes the current source to turn off. In a preferred embodiment, the switches are MOSFETS having low gate capacitance. At the end of sleep mode, the current source may be rapidly turned back on by turning on one of the MOSFETS. Performance of the video DAC is therefore not affected, while power dissipation is substantially reduced, facilitating higher-level integration and compliance with the Green PC standard. Reduced power dissipation also allows for use of an inexpensive chip package, reducing manufacturing cost, and increases reliability of the chip.

12 Claims, 2 Drawing Sheets

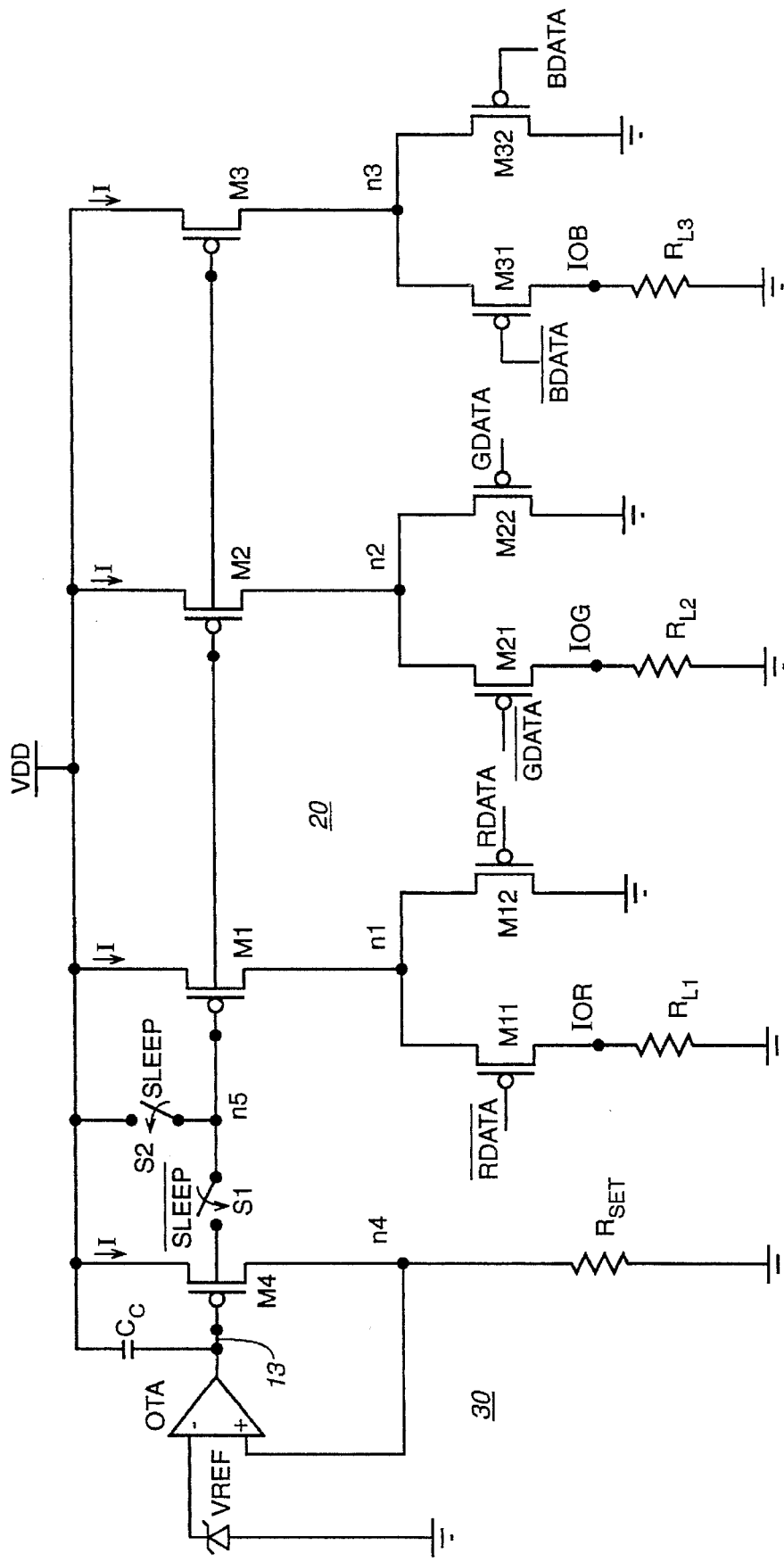
FIG.—1
*(PRIOR ART)*

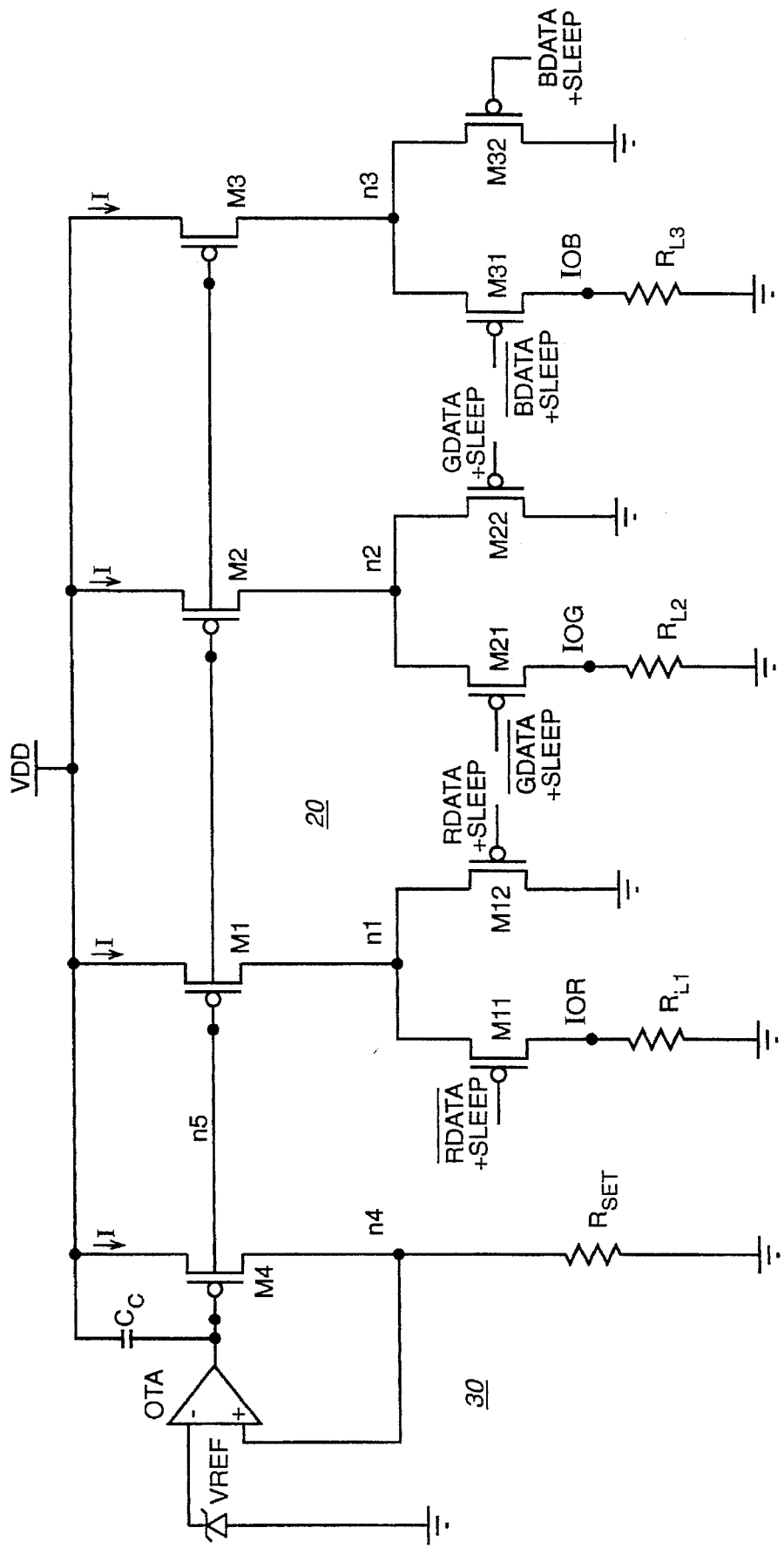
FIG._2

DYNAMIC POWER SAVING VIDEO DAC

BACKGROUND OF THE INVENTION

1. Field of the Invention

The present invention relates to video digital to analog converters (video DACs) and more particularly to current steering video DAC in which the current is periodically turned off to reduce power dissipation.

2. State of the Art

In computer display systems, display information is represented in computer memory by what may be imagined as a three dimensional array of binary digits. The first two dimensions correspond to the dimensions of the computer display in terms of pixel elements. For example, if the computer display has 640×480 picture elements, these picture elements are represented in computer memory by what may be conceived of as a 640×480 array of binary digits, or bits. For grayscale and color displays, the third dimension of the array of binary digits corresponds to the intensity with which each pixel is to be displayed. For example, if each picture element is to be displayed at one of 256 different possible intensities, then 8 bits are required for each pixel to represent the intensity of that pixel. To display the image on the computer display, a series of 8-bit words each representing the intensity of a single pixel is read out of the computer memory and applied to a digital-to-analog converter to produce a signal of corresponding intensity.

In the case of a color display, each 8-bit word is first applied to a color look-up table stored in random access memory. Contained in the color look-up memory are expanded digital words representing a sub-set (palette) of active display colors of a set of possible colors. The expanded digital words are logically divided into three portions, each corresponding to a primary display color such as red, green or blue. Each of these portions of the overall digital word is input to a separate digital-to-analog converter corresponding to a particular primary color to produce analog red, green and blue display signals.

To perform digital-to-analog conversion, an incremental voltage or current is added to a cumulative voltage or current for each possible digital value up to and including the digital value being converted. Of overriding importance is that the incremental voltage or incremental current be substantially constant. To generate the aforementioned incremental voltage or current, digital-to-analog converters require that a reference voltage or reference current be input to the digital-to-analog converter. From a reference voltage or reference current, a reference generator of the digital-to-analog converter then generates the incremental voltage or current.

Recently, single-chip graphics subsystems have been developed that provide a higher level of integration than previous graphics subsystems in order to reduce system cost and to save valuable board space in both laptop and notebook computer applications. A single-chip graphics subsystem typically consists of a graphics controller with hardware accelerator, a RAMDAC (i.e., a combination random access memory and digital to analog converter) and frequency synthesizers. To provide high video resolution, the RAMDAC must operate at high speeds. The accompanying high power dissipation of a high speed RAMDAC has been a significant problem in developing highly-integrated single-chip graphics subsystems.

Furthermore, the PC industry has recently adopted a new "Green PC" standard for desktop computers intended to lessen the environmental impact of personal computers. An object of the standard is to bring all personal computers into compliance with low power design requirements.

Attempts have been made to reduce the power dissipation of video DACs based on the recognition that, during the blanking period of an active video display, no current outputs from the three main DAC current sources are required. Therefore, all three DAC current sources may be turned off during the blanking period in order to reduce power consumption without affecting the normal operation of the screen.

A conventional current steering DAC with power-down capability is shown in FIG. 1. Referring to FIG. 1, a triple-DAC (digital to analog converter) portion 20 of the circuit of FIG. 1 includes a transistor pair M11 and M12 for generating a red signal at node IOR, a transistor pair M21 and M22 for generating a green signal at node IOG signal and a transistor pair M31 and M32 for generating a blue signal at node IOB. Current to the respective transistor pairs is supplied by respective ones of transistors M1, M2 and M3. In the illustrated embodiment, all of the transistors are P-channel MOSFETs. The sources of transistors M1, M2 and M3 are connected to a supply voltage VDD, and the gates of transistors M2, M3, M4 are connected through a control switch S1 to a control signal 13 generated by a reference generator portion 30 of the circuit. In response to the control signal 13, each of the transistors M1, M2 and M3 produces a current I that is input to the source of a respective one of the transistor pairs M11/M12, M21/M22, and M31/M32. The drain of one transistor (M11, M21 and M31) of each pair of transistors is connected to a load resistor ($R_{L1}$, $R_{L2}$, and $R_{L3}$, respectively) connected between an output signal terminal for one of the primary colors and ground, and the gates of the same transistors are connected to the complements of data bits representing the desired intensities of the corresponding primary colors. The drain of the other transistor (M12, M22, and M32) of each of pair of transistors is connected to ground, and the gates of the same transistors are connected to the true form of the data bits. Therefore, when the red data bit RDATA is a 0, the current I is shunted to ground through transistor M12, and when the red data bit RDATA is a 1, the current I is output to the red output terminal through the transistor M11.

For simplicity, only one cell of the digital-to-analog converter is shown for each of the primary colors. In actual practice, the cells are repeated a number of times equal to the number of possible input values. For example, if 256 digital input values are possible, the cells may be imagined as being stacked 256 deep in a direction into the page. Half of the cells would be controlled in accordance with the most significant data bit, half of the remaining cells would be controlled in accordance with the next most significant data bit, and so forth. For each of the primary colors, the output currents for each of the cells are combined and used to produce a corresponding output voltage at the respective output terminal IOR, IOG, or IOB.

Hence, during active operation, the gates of each pass transistor pair (i.e., M11 and M12, M21 and M22, M31 and M32) are driven by complementary signal pairs (i.e., RDATA and $\overline{\text{RDATA}}$, GDATA and $\overline{\text{GDATA}}$, BDATA and $\overline{\text{BDATA}}$). The currents from the three current-sources (i.e., M1, M2 and M3) are steered either into the external resistive loads (i.e., $R_{L1}$, $R_{L2}$ and $R_{L3}$) by turning the pass transistors M11, M21 and M31 on and M12, M22 and M32 off, or into ground (i.e., VSS) by turning the pass transistors M12, M22 and M32 on and M11, M21 and M32 off.

During video blanking, the DAC is placed in a power-conserving sleep mode. Conventionally, to place the DAC in sleep mode (or into power-down operation), the gates of the P-channel current sources (i.e., M1, M2 and M3) are shorted to the VDD terminal by opening the switch S1 and closing the switch S2 in accordance with a control signal SLEEP. The control signal SLEEP is generated from the composite blanking signal in the graphics subsystem. The SLEEP signal is active high during the blanking period and becomes low when the blanking signal is inactive. However, the three current sources (i.e., M1, M2 and M3 of FIG. 1) will wake up slowly after the blanking signal goes inactive due to a large compensation capacitor $C_C$ in the reference generator portion 30 of the DAC. The compensation capacitor $C_C$ (typically about 0.1 µF) is connected to the gates of the current sources through the control line 13, causing the gates of the current sources to exhibit a large time constant. This large time constant causes a large time delay in the resumption of the active video signal, distorting the video picture. Therefore, the conventional circuit is not suitable for dynamic power saving applications.

What is needed, then, is a way to reduce the high power dissipation of a high-speed video DAC without compromising its performance.

SUMMARY OF THE INVENTION

According to the present invention, generally speaking, power dissipation is reduced in a video DAC by providing a sleep mode in which DAC current sources are shut off during the blanking period in a manner that allows them to be rapidly turned back on at the end of sleep mode. In particular, in accordance with one embodiment of the invention, a digital to analog converter includes a current source for producing a current, a current steering circuit connected to the current source, the current steering circuit including switches responsive to first and second control signals, respectively, for steering the current into either a load or a current return path, and a control circuit for generating the first and second signals each as a logical combination of a video data signal and a sleep signal. The sleep signal, when it is active, causes both the first and second switches to turn off, which in turn causes the current source to turn off. In a preferred embodiment, the switches are MOSFETS having low gate capacitance. At the end of sleep mode, the current source may be rapidly turned back on by turning on one of the MOSFETS. Performance of the video DAC is therefore not affected, while power dissipation is substantially reduced, facilitating higher-level integration and compliance with the Green PC standard. Reduced power dissipation also allows for use of an inexpensive chip package, reducing manufacturing cost, and increases reliability of the chip.

BRIEF DESCRIPTION OF THE DRAWING

The present invention may be further understood from the following description in conjunction with the appended drawing. In the drawing:

FIG. 1 is a circuit diagram showing in part a conventional power-saving digital to analog converter; and FIG. 2 is a circuit diagram of one embodiment of a dynamic power saving digital to analog converter in accordance with the present invention.

DETAILED DESCRIPTION OF THE PREFERRED EMBODIMENTS

Referring to FIG. 2, the dynamic power-down DAC of a preferred embodiment of the present invention has a similar circuit configuration as a conventional DAC without the power-down feature (i.e., without the switches S1 and S2 of FIG. 1). As compared to the conventional DAC without the power-down feature, however, the control signals for the pass transistor pairs of the present dynamic power-down DAC have an extra control signal SLEEP which is logically combined with the digital color data.

During power-down operation, the current paths of the current sources (i.e., M1, M2 and M3) are turned off by shutting off all the pass transistor pairs (i.e., M11 and M12, M21 and M22, M31 and M32) at the same time when the control signal SLEEP becomes active during the blanking period. The gates of the pass transistor pairs are controlled by complementary digital video signals "logic ORed" with a SLEEP signal. During the power down period, both gates of the pass transistor pairs are forced to VDD to shut off the current paths and reduce power consumption.

When the current sources are turned back on after the blanking signal goes inactive, they can "wake up", or be turned fully on, within one or two pixel clock periods after the SLEEP signal goes low. The much faster response time of the present power-saving DAC (as compared to the power-saving DAC of FIG. 1) is made possible in that the parasitic capacitance of the gates of the pass transistor pairs (i.e., M11 and M12, M21 and M22, M31 and M32) is much smaller than that of the current sources (i.e. M1, M2 and M3).

Power dissipation of the present dynamic power-saving video DAC has been shown to be 25% less than conventional video DACs without any power-saving feature. Of equal importance, the performance of the video DAC is not adversely affected.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A digital to analog converter comprising current source means for producing a current;

current steering means connected to the current source means, the current steering means comprising switching means responsive to first and second control signals, respectively, for steering the current into one of a load and a current return path; and means for generating the first and second signals each as a logical combination of a video data signal and a sleep signal, the sleep signal, when it is active, causing both the first and second switching means to turn off, the current source means remaining turned on;

whereby dynamic power management may be performed in which the first and second switching means are turned off for relatively short periods of time and afterwards turned quickly back on.

2. The apparatus of claim 1, wherein the switching means comprises a pair of transistors connected in parallel.

3. The apparatus of claim 2, wherein the transistors are MOSFETs, the first signal being connected to a gate of one of the transistors and the second signal being connected to a gate of another of the transistors.

4. The apparatus of claim 3, wherein the means for generating comprises means for logically ORing the video data signal in its true form with the sleep signal to produce the first signal and for logically ORing the video data signal its complement form with the sleep signal to produce the second signal.

5. The apparatus of claim 4, wherein the first signal is connected to a one of the transistors that steers the current into the current return path, and the second signal is connected to another of the transistors that steers the current into the load.

6. The apparatus of claim 5, wherein the load is a resistor.

7. The apparatus of claim 3, wherein the current source means comprises a MOSFET.

8. A power-saving video digital to analog converter having an active mode and a sleep mode, comprising:

a source of power and a source of ground;

a reference generator that produces a control signal;

a plurality of transistors connected to power and to the control signal in current mirror configuration so as to produce a plurality of substantially identical currents at a corresponding plurality of circuit nodes;

a corresponding plurality of transistor pairs, both transistors within each transistor pair being connected to a same one of the plurality of circuit nodes; and a corresponding plurality of signal pairs, each signal of a pair being connected to a transistor of a pair to turn that transistor on or off, the signals in each signal pair being such that, in active mode, one and only one transistor in each transistor pair is fully turned on at a time and such that, in sleep mode, both transistors in each transistor pair are fully turned off, said plurality of transistors connected to power and to the control signal in current mirror configuration remaining turned on;

whereby dynamic power management may be performed in which each transistor in each transistor pair is turned off for relatively short periods of time and afterwards turned quickly back on.

9. The apparatus of claim 8, wherein within each transistor pair, a first transistor is connected between one of the plurality of circuit nodes and ground and a second transistor is connected in series with a load resistor, a series combination of the second transistor and the load resistor being connected between a same one of the plurality of circuit nodes and ground.

10. The apparatus of claim 9, wherein all of the transistors are MOSFETs.

11. The apparatus of claim 9, wherein said plurality equals three, a first transistor pair producing a red output signal across an associated load resistor, a second transistor pair producing a green output signal across an associated load resistor, and third transistor pair producing a blue output across an associated load resistor.

12. The apparatus of claim 11, wherein first and second signals of the respective signal pairs are connected to the first and second transistors of the respective transistor pairs and are defined by the following logical equations:

$$RDATA+SLEEP, \overline{RDATA}+SLEEP$$

$$GDATA+SLEEP, \overline{GDATA}+SLEEP$$

$$BDATA+SLEEP, \overline{BDATA}+SLEEP,$$

where RDATA, GDATA and BDATA are bits of like significance of red, green and blue video values, respectively, and SLEEP is a signal indicating sleep mode.

* * * * *